US010761278B2

(12) United States Patent
Jiang et al.

(10) Patent No.: US 10,761,278 B2
(45) Date of Patent: Sep. 1, 2020

(54) OPTICAL SUBASSEMBLY AND OPTICAL MODULE (71) Applicant: Hisense Broadband Multimedia Technologies Co., Ltd., Qingdao, Shandong (CN)

(72) Inventors: Tao Jiang, Shandong (CN); Qifei Zheng, Shandong (CN); Haixiang Zhang, Shandong (CN)

(73) Assignee: HISENSE BROADBAND MULTIMEDIA TECHNOLOGIES CO., LTD., Qingdao (CN)

( * ) Notice: Subject to any disclaimer, the term of this patent is extended or adjusted under 35 U.S.C. 154(b) by 0 days.

(21) Appl. No.: 16/393,068

(22) Filed: Apr. 24, 2019

(65) Prior Publication Data
US 2019/0285816 A1 Sep. 19, 2019

Related U.S. Application Data (63) Continuation of application No. PCT/CN2019/078714, filed on Mar. 19, 2019.

(30) Foreign Application Priority Data

Mar. 19, 2018 (CN) .......................... 2018 1 0225787
Mar. 19, 2018 (CN) .......................... 2018 1 0227365

(51) Int. Cl.
*G02B 6/42* (2006.01)
*H05K 3/34* (2006.01)
*H05K 1/14* (2006.01)

(52) U.S. Cl.
CPC .......... *G02B 6/4244* (2013.01); *G02B 6/424* (2013.01); *G02B 6/4246* (2013.01);
(Continued)

(58) Field of Classification Search
CPC .. G02B 6/4244; G02B 6/4246; G02B 6/4292; G02B 6/424; G02B 6/4208;
(Continued)

(56) References Cited

U.S. PATENT DOCUMENTS 6,075,635 A * 6/2000 Butrie ................. G02B 6/4207
385/24
6,334,716 B1 * 1/2002 Ojima ................. G02B 6/4246
385/88

(Continued)

FOREIGN PATENT DOCUMENTS

CN 202019358 U 10/2011
CN 102279445 A 12/2011
(Continued)

OTHER PUBLICATIONS

State Intellectual Property Office of the People's Republic of China, Office Action and Search Report Issued in Application No. 201810227365.6, dated May 5, 2019, 14 pages,(Submitted with Machine Translation).

(Continued)

*Primary Examiner* — Ryan A Lepisto
(74) *Attorney, Agent, or Firm* — Hauptman Ham, LLP (57) ABSTRACT

An optical subassembly and an optical module are provided. The optical subassembly includes an optical transmitter, an optical receiver, an optical splitter, and an optical fiber stub. The optical transmitter is configured to transmit light from the optical transmitter to the optical fiber stub through the optical splitter. The optical splitter is configured to reflect light from the optical fiber stub to the optical receiver. An optical axis of the optical receiver and an optical axis of the optical fiber stub form an acute angle. An optical axis of the optical transmitter and the optical axis of the optical fiber stub also form an acute angle.

13 Claims, 5 Drawing Sheets (52) U.S. Cl.
CPC .......... *G02B 6/4292* (2013.01); *H05K 1/141* (2013.01); *H05K 3/3405* (2013.01); *H05K 2201/10121* (2013.01); *H05K 2201/10446* (2013.01)

(58) Field of Classification Search
CPC ................ H05K 3/3405; H05K 1/141; H05K 2201/10446; H05K 2201/10121
See application file for complete search history.

(56) References Cited

U.S. PATENT DOCUMENTS

| | | | | |
|---|---|---|---|---|
| 7,556,439 | B2 * | 7/2009 | Nakanishi | G02B 6/4246 385/24 |
| 2013/0330044 | A1 | 12/2013 | Wu | |
| 2018/0269971 | A1 * | 9/2018 | Tang | G02B 6/4292 |

FOREIGN PATENT DOCUMENTS

| CN | 202330786 U | 7/2012 | | |
|---|---|---|---|---|
| CN | 20112428695 U | * 7/2012 | ............... | G02B 6/42 |
| CN | 202737878 U | 2/2013 | | |
| CN | 104166194 A | 11/2014 | | |
| CN | 204694888 U | 10/2015 | | |
| CN | 20152462484 U | * 10/2015 | ............... | G02B 6/42 |
| CN | 205176333 U | 4/2016 | | |
| CN | 106054329 A | 10/2016 | | |
| CN | 106646775 A | 5/2017 | | |
| CN | 108427161 A | 8/2018 | | |
| CN | 108646356 A | 10/2018 | | |
| EP | 0542011 A1 | 5/1993 | | |
| JP | 2008-47201 A | * 2/2008 | ............ | G11B 7/135 |
| JP | 2012189948 A | 10/2012 | | |
| WO | 2017132834 A1 | 8/2017 | | |

OTHER PUBLICATIONS

State Intellectual Property Office of the People's Republic of China, Office Action and Search Report Issued in Application No. 201810225787.X, dated Jun. 5, 2019, 11 pages,(Submitted with Machine Translation).

ISA State Intellectual Property Office of the People's Republic of China, International Search Report Issued in Application No. PCT/CN2019/078714, dated Jul. 10, 2019, WIPO, 5 pages.

State Intellectual Property Office of the People's Republic of China, Office Action and Search Report Issued in Application No. 2018102273656, dated May 8, 2020, 15 pages, (Submitted with Machine Translation).

* cited by examiner

OPTICAL SUBASSEMBLY AND OPTICAL MODULE

CROSS-REFERENCE TO RELATED APPLICATIONS

This application is a continuing application of PCT Patent Application No. PCT/CN2019/078714, filed on Mar. 19, 2019, which claims priority to Chinese Patent Application No. 201810227365.6 entitled "TRANSCEIVER OPTICAL SUBASSEMBLY AND OPTICAL MODULE THEREOF" filed on Mar. 19, 2018, and Chinese Patent Application No. 201810225787.X entitled "OPTICAL MODULE" filed on Mar. 19, 2018, the entire contents of which are incorporated herein by reference.

TECHNICAL FIELD

The present disclosure relates to optical fiber communication technology and in particular, to an optical subassembly and an optical module with the optical subassembly.

BACKGROUND

Passive optical access systems based on gigabit-capable passive optical networks (GPON) have been widely deployed in the market. An optical line terminal (OLT) device is a key central office device in the GPON.

SUMMARY

A first aspect of the present disclosure is related to an optical subassembly. The optical subassembly comprises: an optical transmitter, an optical receiver, an optical splitter and an optical fiber stub. The optical transmitter is configured to transmit light from the optical transmitter to the optical fiber stub through the optical splitter. The optical splitter is configured to reflect light from the optical fiber stub to the optical receiver. An optical axis of the optical receiver and an optical axis of the optical fiber stub form an acute angle. An optical axis of the optical transmitter and the optical axis of the optical fiber stub form an acute angle.

A second aspect of the present disclosure is related to an optical module. The optical module comprises a housing, a circuit board and the optical subassembly of the first aspect. The optical subassembly is electrically connected with the circuit board. The optical transmitter of the optical subassembly comprises a first pin facing the circuit board. The optical receiver of the optical subassembly comprises a second pin facing a bottom surface of the housing.

BRIEF DESCRIPTION OF THE DRAWINGS

For convenience of description, the present disclosure will be detailed with reference to the following examples and accompanying drawings.

DETAILED DESCRIPTION

To make the objects, technical solutions and advantages of the present disclosure clearer, the present disclosure will be further described in details in combination with accompanying drawings and examples. It is understood that the specific examples described herein are only used to explain the present disclosure rather than limit the present disclosure.

In the description of the present disclosure, it is to be understood that orientations or positional relationships indicated by terms such as "center", "longitudinal", "transverse", "length", "width", "thickness", "upper", "lower", "front", "rear", "left", "right", "vertical", "horizontal", "top", "bottom", "inside", "outside", "clockwise" and "counter-clock wise" are based on orientations or positional relationships shown in the drawings and are used only for convenience and simplification of descriptions of the present disclosure, rather than indicate or imply that the indicated apparatus or element shall have a specific orientation and be configured or operated in a specific orientation. Thus, the terms shall not be construed as limiting of the present disclosure. In addition, terms "a first" and "a second" are used only for descriptions and shall not be understood as indicating or implying relative importance or implying a number of the indicated technical features. Thus, elements limited by "a first" and "a second" may explicitly or implicitly include one or more features. In the descriptions of the present disclosure, "a plurality" refers to two or more unless otherwise stated clearly.

In the descriptions of the present disclosure, it is noted that terms "mounting", "communication" and "connection" shall be understood in a broad sense unless otherwise stated clearly. For example, the terms may refer to a fixed connection, and may also refer to a detachable connection or an integrated connection. Further, the terms may refer to a mechanical connection, and may also refer to an electrical connection, a direct connection and an indirect connection via a medium. Also, the terms may refer to internal communication of two elements or mutual interaction of two elements. Those skilled in the prior art may understand the specific meanings of the above terms in the present disclosure based on actual situations.

An optical line terminal (OLT) device may be connected with a front-end switch through a network line and configured to convert electrical signals from the front-end switch into optical signals, and connected with a user-end optical splitter through a single optical fiber. The OLT device is provided with a hot-pluggable optical module.

An optical subassembly in the present disclosure is an optical subassembly with a single data transmitting channel and a single data receiving channel. The optical subassembly is a device for converting electric signals into optical signals or optical signals into electrical signals in an optical communication system.

Figure 1:
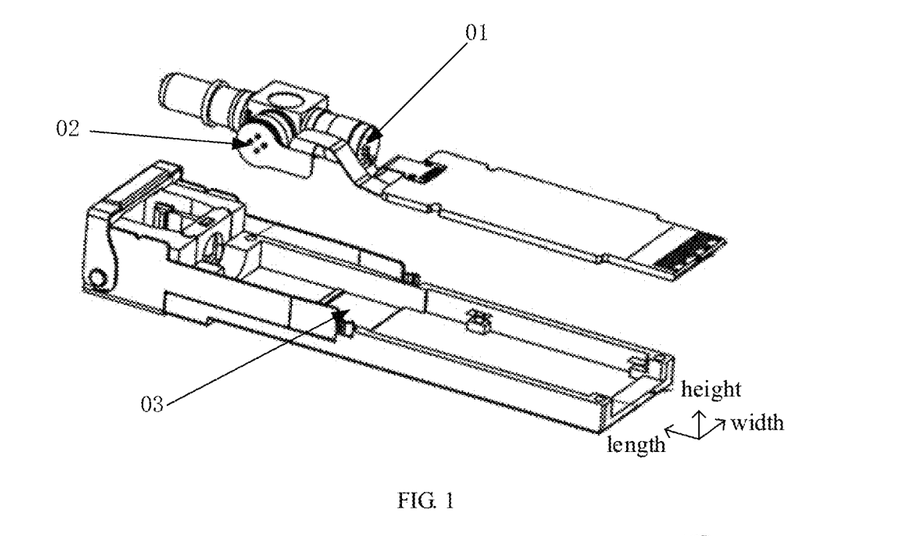
FIG. 1 is a schematic diagram illustrating a structure of an optical module, in accordance with one or more embodiments of the present disclosure.

FIG. 1 is a schematic diagram illustrating a structure of an optical module, in accordance with one or more embodiments. As shown in FIG. 1, a pin 01 of an optical transmitter of an optical subassembly in an optical module faces a circuit board, a pin 02 of an optical receiver faces a side wall of a housing and the pin 02 of the optical receiver is substantially parallel to a bottom surface 03 of the housing.

According to an industrial standard/protocol, the housing of the optical module is in the shape of a slightly irregular cuboid with a height smaller than a width. When placed in the housing of the optical module, the optical subassembly is disposed in a manner as shown in FIG. 1, because the optical subassembly cannot be received in a height direction of the optical module, that is, between the top surface and the bottom surface of the optical module. In this way, there is no sufficient internal space in the optical module to place two optical subassemblies.

Figure 2:
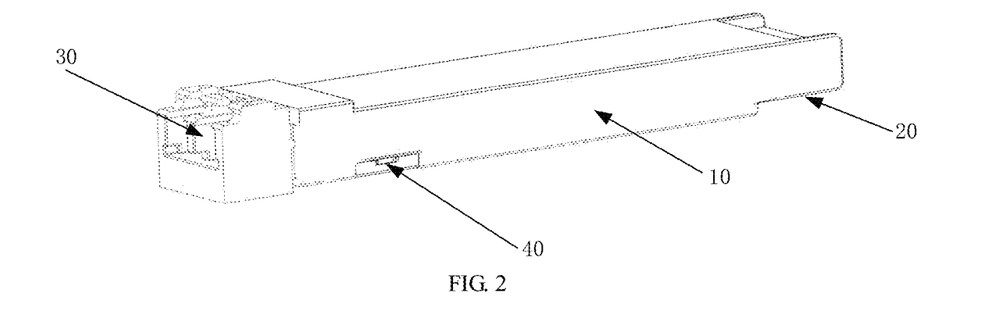
FIG. 2 is a schematic diagram illustrating an external structure of an optical module, in accordance with one or more embodiments of the present disclosure.

FIG. 2 is a schematic diagram illustrating an external structure of an optical module, in accordance with one or more embodiments of the present disclosure. As shown in FIG. 2, the optical module includes an optical interface 30, an electrical interface 20 and a housing 10. A seal 40 is attached on the outer surface of the housing 10. The optical interface 30 is an interface for optical connection between the optical module and the external and is usually used for insertion of an optical fiber. The electrical interface 20 is an interface for electrical connection between the optical module and the external and is usually used for electrical connection with an external device through a golden finger. The housing 10 is configured to house devices such as the optical subassembly and the circuit board in the optical module. In some embodiments of the present disclosure, to satisfy space requirement of the optical subassembly, an opening may be arranged in the bottom surface of the housing to increase the space in the height direction of the housing and the opening can be sealed with a seal 40 on the outer surface of the housing.

Figure 3:
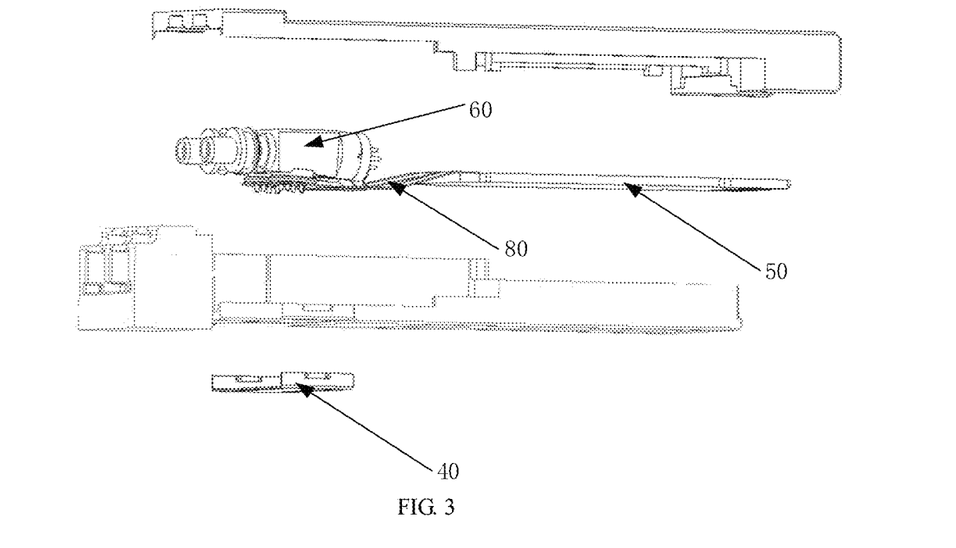
FIG. 3 is an exploded view illustrating a structure of an optical module, in accordance with one or more embodiments of the present disclosure.

FIG. 3 is an exploded view illustrating a structure of an optical module, in accordance with one or more embodiments of the present disclosure. As shown in FIG. 3, a circuit board 50, a first optical subassembly 60, and a second optical subassembly 70 are provided in the optical module. The first optical subassembly 60 and the second optical subassembly 70 are in electrical connection with the circuit board 50 through a flexible circuit board 80, respectively.

In one or more embodiments of the present disclosure, two optical subassemblies are provided in the housing. An optical subassembly includes an optical transmitter, an optical receiver, an optical splitter and an optical fiber stub. Optical transmission and reception functions can be realized with one optical subassembly and double receptions and double transmissions can be realized with coaxially-packaged lasers and optical detectors for two optical subassemblies. In a non-coaxial packaging scenario, such as Chips on Board (COB) packaging and micro-optics packing, it is relatively easier to realize multi-channel transmission and reception. However, because coaxial packaging occupies a larger space, it is difficult to place two optical subassemblies in the optical module in this case.

In some embodiments of the present disclosure, a design for placing two optical subassemblies in an optical module is provided.

In some embodiments of the present disclosure, an optical module is provided, including a housing, a first optical subassembly, a second optical subassembly and a circuit board, where the first optical subassembly and the second optical subassembly are electrically connected with the circuit board, respectively.

A pin of an optical transmitter of the first optical subassembly and a pin of an optical transmitter of the second optical subassembly both face the circuit board.

A pin of an optical receiver of the first optical subassembly and a pin of an optical receiver of the second optical subassembly both face a same bottom surface of the housing.

In some embodiments of the present disclosure, an optical module is provided, including a housing, a first optical subassembly and a circuit board, where the first optical subassembly is electrically connected with the circuit board.

A pin of an optical transmitter of the first optical subassembly faces the circuit board.

A pin of an optical receiver of the first optical subassembly faces a bottom surface of the housing.

In the optical module of some embodiments of the present disclosure, the pin of the optical transmitter of the optical subassembly faces the circuit board and the pin of the optical receiver of the optical subassembly faces a bottom surface of the housing, thereby making the most of the internal space of the housing of the optical module.

In some embodiments of the present disclosure, the optical subassembly placed in the optical module has been structurally optimized such that the volume of the optical subassembly is significantly reduced, which makes it easier to place the optical subassembly in the optical module.

Figure 4:
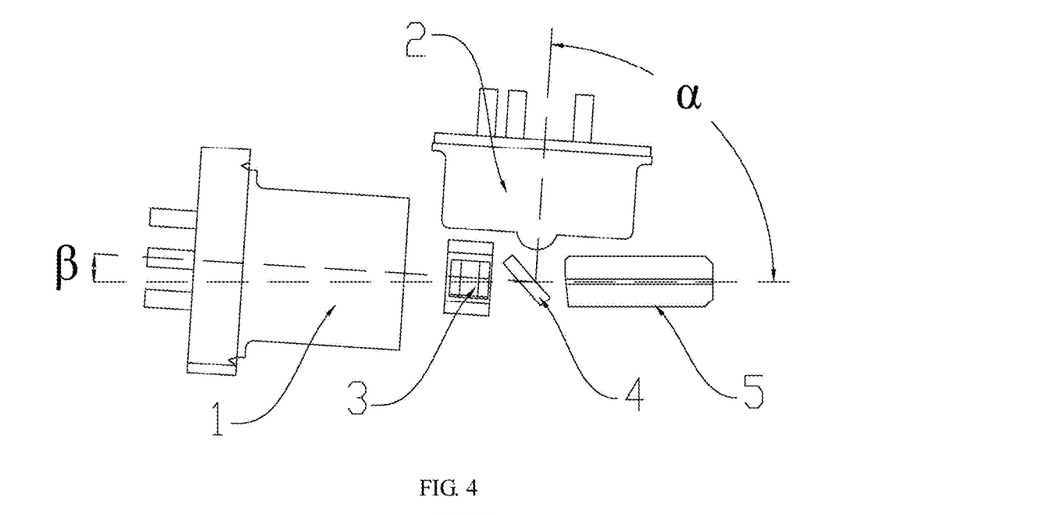
FIG. 4 is a schematic diagram illustrating a configuration of an optical subassembly, in accordance with one or more embodiments of the present disclosure.

In some embodiments, the following scheme is adopted for an optical subassembly. As shown in FIG. 4, the optical subassembly includes an optical transmitter 1, an optical receiver 2, an optical splitter 4 and an optical fiber stub 5. The optical receiver 2 is provided at a side of the optical splitter 4, an optical receiving surface of the optical fiber stub 5 faces the optical splitter 4, and the optical fiber stub 5 is a single-mode optical fiber stub for connecting an optical fiber. The optical transmitter 1, the optical splitter 4 and the optical fiber stub 5 are provided at a same plane, which is referred to as a main plane of the optical subassembly. Specifically, the optical transmitter 1 and the optical receiver 2 are packaged by Transistor Outline-can (TO-CAN). In some embodiments, the optical transmitter 1 can construct a data transmitting channel, the optical receiver 2 can construct a data receiving channel; and the optical splitter 4 is used for transmission of light of a first wavelength from the optical transmitter and reflection of light of a second wavelength from the optical fiber.

Light from the optical transmitter 1 is emitted from its light-emitting surface and the light travels along an optical axis of the optical transmitter, passes through the optical splitter 4 and then enters the optical fiber connected with the optical fiber stub 5. Light from the optical fiber stub is reflected by the optical splitter 4 and then irradiates into a surface of the optical receiver 2 for receiving light and the light received by the optical receiver travels along an optical axis of the optical receiver. The optical axis of the optical receiver 2 and an optical axis of the optical fiber stub 5 form an acute angle and the optical axis of the optical transmitter 1. The optical axis of the optical fiber stub 5 also form an acute angle.

In some embodiments, the optical subassembly further includes an optical isolator 3, which is provided between the optical transmitter 1 and the optical splitter 4. The light from the optical transmitter 1 enters into the optical splitter 4 through the optical isolator 3. The optical isolator 3 is a passive optical device only allowing transmission of light in a specific direction, and whose principle is based on non-reciprocity of Faraday rotation. The optical isolator 3 is configured to prevent light from, or reflected by, the optical fiber stub 5 from entering the optical transmitter 1, thereby maintaining good modulation performance of the optical transmitter 1.

In some embodiments, an optical path transmission includes the following two processes.

During a first process, light of a first wavelength from the optical transmitter 1 passes through the optical splitter 4 by transmission and then irradiates into the optical fiber stub 5. In the first transmission process, the entire path consumption is within 10%.

In a second process, light of a second wavelength from the optical fiber stub 5 is reflected by the optical splitter 4 and then incident into the optical receiver 2. In the transmission process, the entire path consumption is within 3%.

Therefore, in the transmission processes of the present disclosure, transmission consumption is low, which is helpful for maintaining transmission efficiency.

In some examples, the optical transmitter 1 has a light emitting surface from which light is emitted and a non-spherical lens for converging light from the optical transmitter 1, which is useful for determining a definite optical axis.

In some examples, the optical receiver 2 is provided with a lens, whose focal length is a focal length of the optical receiver. A sum of a distance from the optical receiver of the optical subassembly to the optical splitter and a distance from the optical splitter to the optical fiber stub is equal to the focal length of the optical receiver of the optical subassembly.

To better understand the present disclosure, configurations of the optical subassembly are further discussed below with reference to FIG. 5.

The optical axis of the optical receiver of the optical subassembly and the optical axis of the optical fiber stub form an acute angle α.

The optical axis of the optical receiver inclines toward the optical axis of the optical fiber stub such that the height of the optical receiver may be reduced, resulting in decreased volume of the optical subassembly. In some examples, when an angle between the optical splitter and the optical axis of the optical transmitter is 45 degrees, an optimum splitting effect is able to be realized. To maintain the splitting effect, the angle between the optical axis of the optical transmitter and the optical splitter is maintained at 45 degrees. In some examples, the optical splitter 4 is a spectroscope having a mirror surface.

Figure 5:
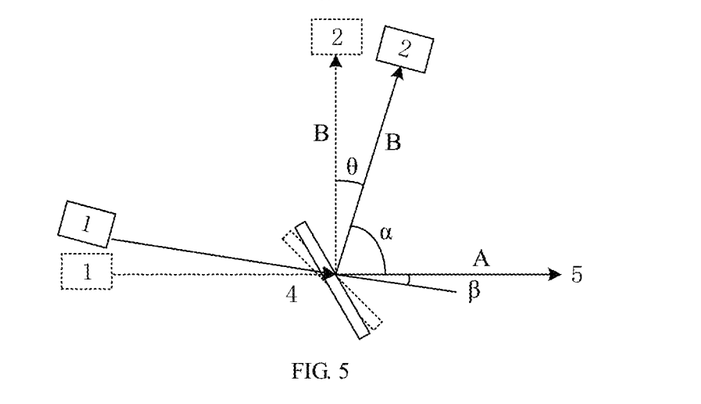
FIG. 5 is a schematic diagram illustrating positional relationship of components in an optical subassembly, in accordance with one or more embodiments of the present disclosure.

As shown by components indicated by dotted lines in FIG. 5, if a distance from the optical receiver 2 to the optical splitter 4 is B, a sum of the distance B and a distance A from the optical splitter 4 to the optical fiber stub 5 is equal to a focal length F of the lens on the optical receiver 2. When the optical splitter 4 and the optical axis of the optical fiber stub 5 form an 45° angle, the optical axis of the optical receiver 2 and the optical fiber stub 5 form a 90° angle. The height of the optical subassembly is H which is equal to B plus a height of the optical receiver 2.

As shown by components indicated by solid lines in FIG. 5, when the angle between the optical splitter 4 and the optical axis of the optical fiber stub 5 is reduced by θ/2, the angle between the optical axis of optical receiver 2 and the optical axis of the optical fiber stub is reduced by θ. Since the focal length F of the lens remains unchanged, a portion of the height H that is related to B is reduced to B×cos θ, that is, the packaging height of the optical subassembly is reduced by to B×(1−cos θ) when the focal length remains unchanged.

In some embodiments, a coupling efficiency of light entering the optical fiber stub can be maintained by keeping the focal length unchanged.

In some embodiments, adjusting the angle between the optical splitter and the optical axis of the optical fiber stub makes it possible for the height of the optical receiver to be reduced, which contributes to the volume decrease of the optical subassembly. In this case, the angle between the optical axis of the optical receiver and the optical axis of the optical fiber stub changes to an acute angle α as well.

In some embodiments, the angle α between the optical axis of the optical receiver and the optical axis of the optical fiber stub is greater than 78° and less than 90°. The angle β between the optical axis of the optical transmitter and the optical axis of the optical fiber stub is greater than zero and less than 6°.

The dotted line in FIG. 5 shows a configuration before a change and the solid line indicates a configuration after the change. Before the change, the angle between the optical axis of the optical transmitter and the optical axis of the optical fiber stub is set to zero.

The angle between the optical splitter and the optical axis of the optical fiber stub 5 is changed by θ/2. To maintain the splitting effect, as a result, the angle β between the optical axis of the optical transmitter 1 and the optical axis of the optical fiber stub is changed from 0 to θ/2. However, this angle change may affect the coupling efficiency of light into the optical fiber stub negatively. To maintain the coupling efficiency, the angle θ/2 between the optical axis of the optical transmitter 1 and the optical axis of the optical fiber stub 5 is set between 3.5° and 4°. Thus, in some examples, the angle β between the optical axis of the optical transmitter 1 and the optical axis of the optical fiber stub 5 is designed to be between 3.5° and 4°.

In the structure mentioned above, the optical transmitter 1 inclines toward the optical receiver 2. The optical transmitter 1 and the optical receiver 2 are set or incline toward a same direction, which allows for further reducing the overall volume of the optical subassembly.

In some embodiments of the present disclosure, the acute angle is designed intentionally for improvement rather than as a result of non-subjective factors such as process errors. The acute angle resulting from the non-subjective factors such as a process error is distinguished from the discussed embodiments of the present disclosure.

Figure 6:
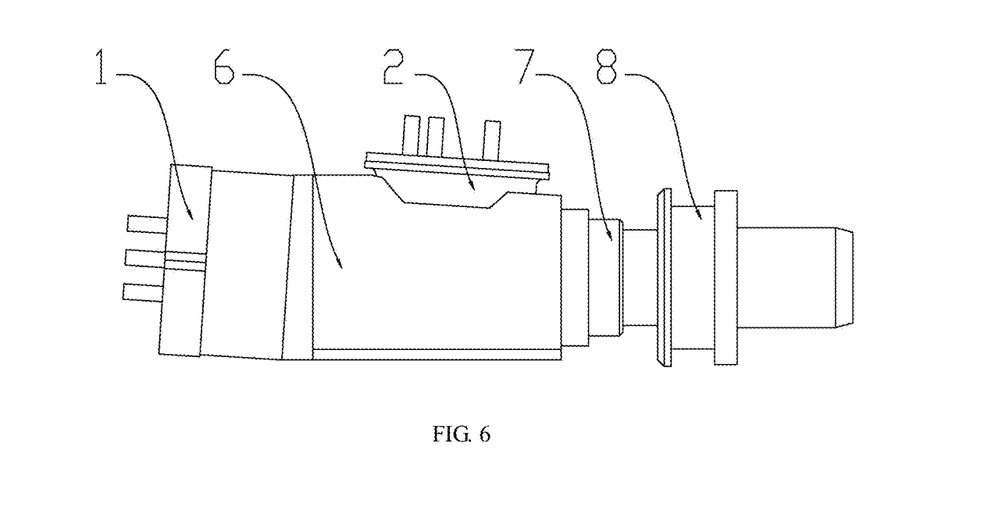
FIG. 6 is a schematic diagram illustrating an external structure of an optical subassembly, in accordance with one or more embodiments of the present disclosure.
Figure 7:
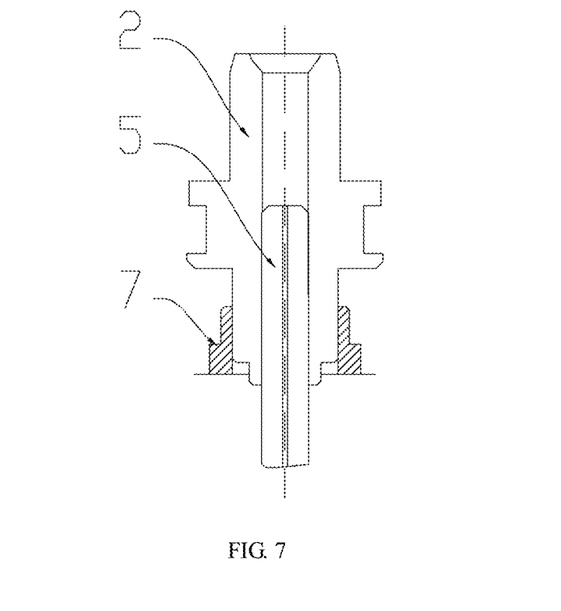
FIG. 7 is a sectional diagram illustrating a structure of part of an optical subassembly, in accordance with one or more embodiments of the present disclosure.

In some embodiments as shown in FIGS. 6 and 7, the optical subassembly further includes a round square tube 6. The optical transmitter 1, the optical splitter 4, the optical isolator 3 and the optical receiver 2 are all mounted in the round square tube 6. One end of the round square tube 6 is welded with a sleeve adjusting component 7 and a mounting hole is arranged in the sleeve adjusting component 7. The optical fiber stub 5 is fixed into a connection sleeve 8 and an outer surface of one end of the connection sleeve 8 is fixedly sleeved into the mounting hole. Since the sleeve adjusting component 7 is fixed on one end of the round square tube 6 by welding, welding deformation phenomenon may occur in a metal after welding, so that the optical fiber stub 5 is tilted relative to the main plane of the optical subassembly, resulting in a reduced light-emitting power. To solve the problem of reduced light-emitting power due to welding deformation of fixing welding, adjustment welding (welding in an adjustable way) is performed on a sleeving position of the mounting hole and the connection sleeve 8 after the sleeve adjusting component 7 is fixedly welded on the round square tube 6 to adjust the welding of related parts. The adjustment welding may be implemented by many types of welding available in the art. For example, if the optical fiber stub 5 is tilted to left due to the welding deformation, spot welding is performed on the right side of the sleeving position. The principle of adjustment welding lies in using the fixing welding as a support point, adjusting the angle between the optical fiber stub 5 and the main plane of the optical subassembly under the push force of the adjustment welding so as to cause the optical path to recover to the state previous to the welding deformation, thereby maximizing the light emitting power.

Figure 8:
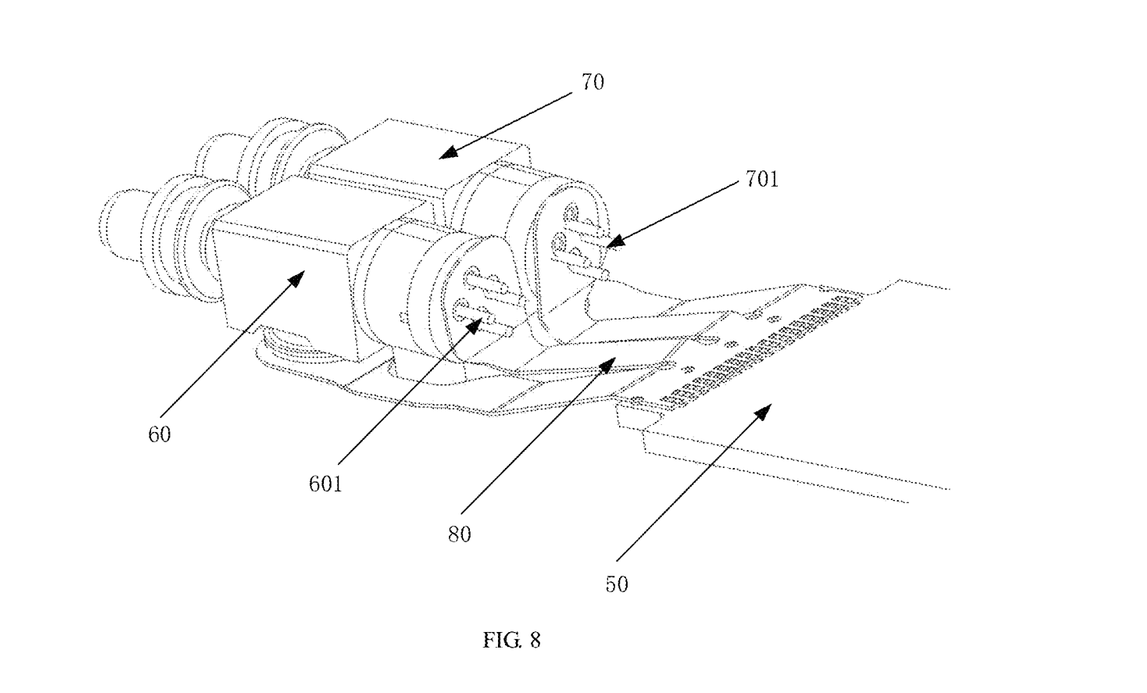
FIG. 8 is a schematic diagram illustrating a structure of an optical module at an angle, in accordance with one or more embodiments of the present disclosure.
Figure 9:
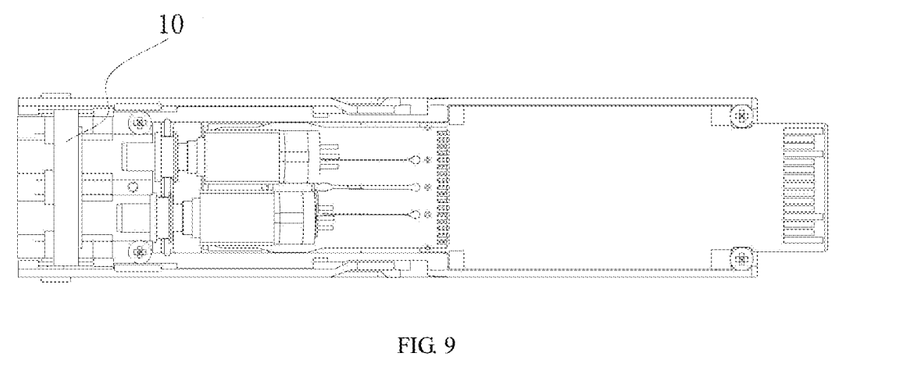
FIG. 9 is a schematic diagram illustrating assembly of optical subassemblies in an optical module, in accordance with one or more embodiments of the present disclosure.

FIG. 8 and FIG. 9 are schematic diagrams illustrating a structure of an optical module at an angle, in accordance with one or more embodiments of the present disclosure. As shown in FIGS. 8 and 9, a first optical subassembly 60 and a second optical subassembly 70 are arranged in parallel in the optical module according to one or more embodiments of the present disclosure. A pin 601 of an optical transmitter of the first optical subassembly 60 and a pin 701 of an optical transmitter of the second optical subassembly 70 extend in a same direction, that is, both extend toward a circuit board. The pins are connected with the circuit board 50 through a flexible circuit board 80. In this way, the height of the optical subassembly is reduced, so that the height of each optical subassembly is able to satisfy the height requirements for a housing of the optical module. Thus, it is feasible to arrange two optical subassemblies vertically in the housing of the optical module.

Figure 10:
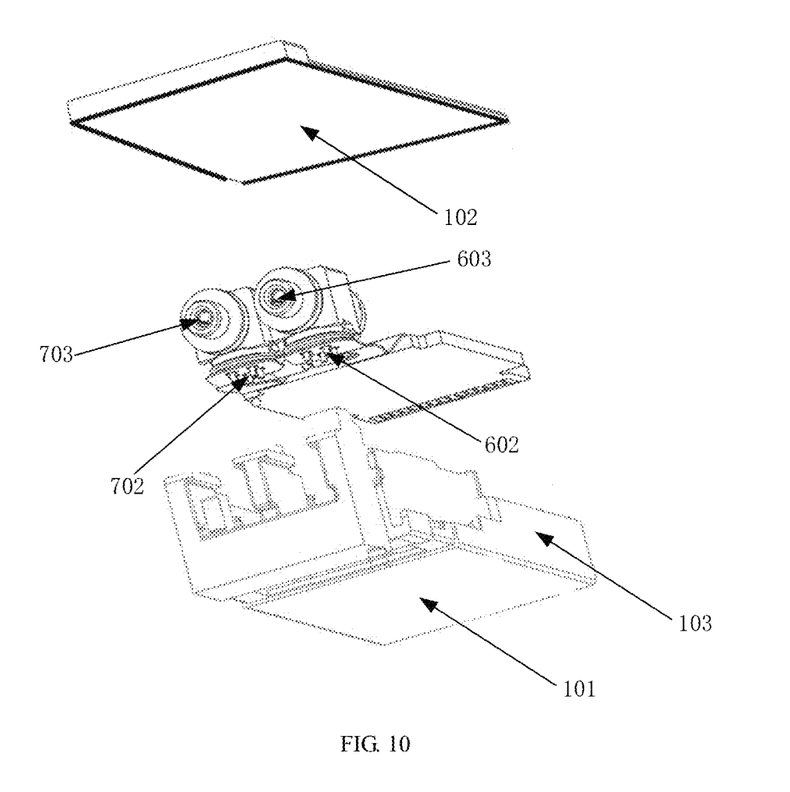
FIG. 10 is an exploded view illustrating a structure of an optical module at an angle, in accordance with one or more embodiments of the present disclosure.

FIG. 10 is an exploded view illustrating a structure of an optical module at an angle, in accordance with one or more embodiments of the present disclosure. As shown in FIG. 10, a top surface 102 and a bottom surface 101 of the housing of the optical module are arranged oppositely and a side surface 103 and the bottom surface 101 of the housing are connected and set to be basically perpendicular to each other.

A pin 602 of an optical receiver of the first optical subassembly 60 and a pin 702 of an optical receiver of the second optical subassembly 70 extend in a same direction, that is, both extend toward the bottom surface 101 of the housing of the optical module.

An optical fiber stub 603 of the first optical subassembly 60 and an optical fiber stub 703 of the second optical subassembly 70 extend in a same direction, that is, both extend toward an optical interface 30 of the optical module.

Figure 11:
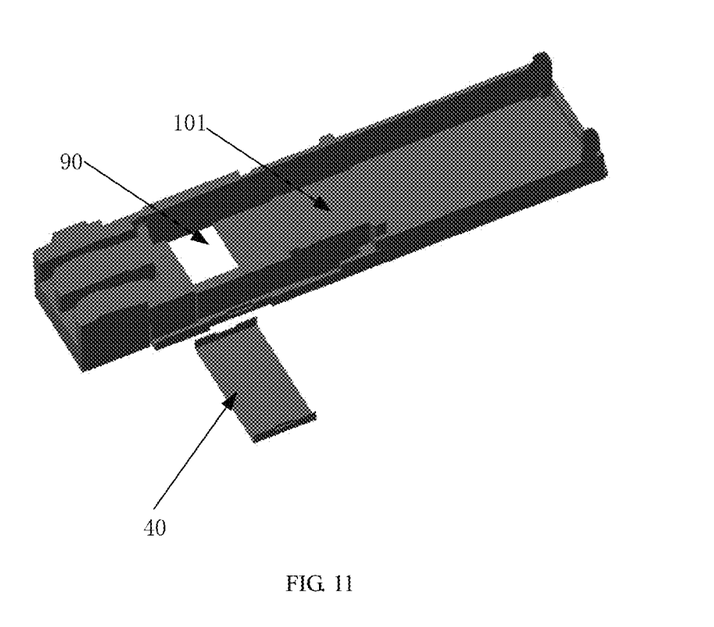
FIG. 11 is a schematic diagram illustrating a structure of a housing of an optical module, in accordance with one or more embodiments of the present disclosure.

FIG. 11 is a schematic diagram illustrating a structure of a housing of an optical module in accordance with one or more embodiments of the present disclosure. As shown in FIG. 11, the bottom surface 101 of the housing has an opening 90 which is sealed by a seal 40 from outside the housing.

According to embodiments of the present disclosure, one more optical subassembly is able to be added without substantial variation in the volume and external structure of the optical module, resulting in a higher port density of a system, a higher integration and a better versatility. It is easier to manufacture the optical modules and control power consumption of the system, which allows for lowering network operation costs.

In the descriptions of the present specification, terms such as "an example", "some examples", "illustrative examples", "embodiments", "a specific example" or "some examples" are intended to refer to that a specific feature, structure, material, or characteristic described in combination with an embodiment or an example are included in at least one embodiment or example of the present disclosure. In the present specification, the illustrative expressions of the above terms do not necessarily refer to a same embodiment or example. Further, specific feature, structure, material or characteristic described above may be combined in a proper way in one or more embodiments or examples.

The foregoing disclosure is merely illustrative of preferred examples of the present disclosure but not intended to limit the present disclosure, and any modifications, equivalent substitutions, adaptations thereof made within the spirit and principles of the disclosure shall fall within the scope of the present disclosure.

The invention claimed is:

1. An optical subassembly, comprising:
an optical transmitter, an optical receiver, an optical splitter and an optical fiber stub, wherein
the optical transmitter is configured to transmit light from the optical transmitter to the optical fiber stub through the optical splitter,
the optical splitter is configured to reflect light from the optical fiber stub to the optical receiver,
an optical axis of the optical receiver and an optical axis of the optical fiber stub form an acute angle,
an optical axis of the optical transmitter and the optical axis of the optical fiber stub form an acute angle, and
a sum of a first distance from the optical receiver to the optical splitter and a second distance from the optical splitter to the optical fiber stub is equal to a focal length of the optical receiver.

2. The optical subassembly according to claim 1, further comprising:
an optical isolator between the optical transmitter and the optical splitter, wherein the optical isolator is configured to transmit the light from the optical transmitter into the optical splitter.

3. The optical subassembly according to claim 2, further comprising:
a tube housing the optical transmitter, the optical splitter, the optical isolator, and the optical receiver;
a sleeve adjusting component on a first end of the tube, the sleeve adjusting component having a mounting hole; and
a connection sleeve within which the optical fiber stud is fixed, the connection sleeve being coupled with the sleeve adjusting component by way of the mounting hole.

4. The optical subassembly according to claim 3, wherein after the sleeve adjustment component is coupled with the first end of the tube by welding, the connection sleeve is further coupled with the mounting hole by an adjustment weld such that the optical fiber stud is in a main plane of the optical assembly where the optical transmitter, the optical splitter, and the optical fiber stub are provided.

5. The optical subassembly according to claim 1, wherein the optical transmitter is inclined toward the optical receiver.

6. The optical subassembly according to claim 1, wherein the optical splitter is a spectroscope having a mirror surface, and the mirror surface of the spectroscope and the optical axis of the optical transmitter form a 45° angle.

7. The optical subassembly according to claim 1, wherein an angle between the optical axis of the optical transmitter and the optical axis of the optical fiber stub is greater than zero and less than 6°, and an angle between the optical axis of the optical receiver and the optical axis of the optical fiber stub is greater than 78° and less than 90°.

8. The optical subassembly according to claim 7, wherein the angle between the optical axis of the optical transmitter and the optical axis of the optical fiber stub is between 3.5° and 4°.

9. The optical subassembly according to claim 1, wherein the optical transmitter comprises a light emitting surface and a non-spherical lens over the light emitting surface.

10. An optical module, comprising a housing, a circuit board, and a first optical subassembly according to claim 1, wherein
the optical subassembly is electrically connected with the circuit board,
the optical transmitter of the first optical subassembly comprises a first pin facing the circuit board, and
the optical receiver of the first optical subassembly comprises a second pin facing a bottom surface of the housing.

11. The optical module according to claim 10, wherein the bottom surface of the housing has an opening, and the optical module further comprises:
a seal in the opening in the bottom surface of the housing that seals the opening in the bottom surface of the housing with respect to an outer surface of the housing.

12. The optical module according to claim 10, further comprising:
a second optical subassembly identical to the first optical subassembly, wherein
the second optical subassembly is electrically connected with the circuit board;
the optical transmitter of the second optical subassembly comprises a third pin facing the circuit board, and
the optical receiver of the second optical subassembly comprises a fourth pin facing the bottom surface of the housing.

13. The optical module according to claim 12, wherein the bottom surface of the housing has an opening, and the optical module further comprises:
a seal in the opening in the bottom surface of the housing that seals the opening in the bottom surface of the housing with respect to an outer surface of the housing.

* * * * *